United States Patent [19]

Chamberlin

[11] Patent Number: 4,502,917

[45] Date of Patent: Mar. 5, 1985

[54] PROCESS FOR FORMING PATTERNED FILMS

[75] Inventor: Rhodes R. Chamberlin, El Paso, Tex.

[73] Assignee: Cherry Electrical Products Corporation, Waukegan, Ill.

[21] Appl. No.: 363,116

[22] Filed: Mar. 29, 1982

Related U.S. Application Data

[62] Division of Ser. No. 186,855, Sep. 15, 1980, Pat. No. 4,344,817.

[51] Int. Cl.³ .................... C03C 17/34; C03C 17/25
[52] U.S. Cl. .................... 156/645; 156/652; 156/656; 156/657; 156/659.1; 156/661.1; 156/901; 427/66; 427/110; 427/126.2; 427/126.3; 428/1
[58] Field of Search ............ 156/645, 650, 651, 652, 156/657, 659.1, 661.1, 901, 656; 427/66, 108, 110, 126.2, 126.3, 157, 259; 428/1

[56] References Cited

U.S. PATENT DOCUMENTS

| | | | |
|---|---|---|---|
| 2,850,409 | 9/1958 | Boicey et al. | 427/110 |
| 3,423,260 | 1/1969 | Heath et al. | 156/650 |
| 3,588,570 | 6/1961 | O'Keeffe | 313/94 |
| 3,647,566 | 3/1972 | Szupillo | 148/6.3 |
| 3,669,770 | 6/1972 | Feldstein | 156/657 |
| 3,874,916 | 4/1975 | Livesay et al. | 430/272 |
| 3,880,633 | 4/1975 | Jordan et al. | 65/60.2 |
| 3,922,420 | 11/1975 | Schnable et al. | 428/210 |
| 3,928,658 | 12/1975 | Van Boxtel et al. | 427/108 |
| 3,959,565 | 5/1976 | Jordan et al. | 428/432 |
| 3,991,227 | 11/1976 | Carlson et al. | 427/39 |
| 4,009,061 | 2/1977 | Simon | 156/635 |
| 4,018,938 | 4/1977 | Feder et al. | 430/296 |
| 4,059,069 | 11/1977 | Ford | 118/642 |
| 4,087,315 | 5/1978 | Auracher et al. | 156/656 |
| 4,095,006 | 6/1978 | Jordan et al. | 427/427 |
| 4,158,072 | 6/1979 | Bohg et al. | 430/313 |
| 4,178,403 | 12/1979 | Sakurai et al. | 428/209 |
| 4,224,355 | 9/1980 | Lampkin et al. | 427/8 |

Primary Examiner—William A. Powell
Assistant Examiner—Thomas Bokan
Attorney, Agent, or Firm—Willian Brinks Olds Hofer Gilson & Lione Ltd.

[57] ABSTRACT

A pattern of transparent conductive material, such as tin oxide, is formed on a transparent vitreous substrate using a polycrystalline material, such as cadmium or zinc sulfide, to mask the substrate surface while depositing material forming the transparent conductive layer. The polycrystalline material and any overlying transparent conductive material are easily removed by a chemical etch, leaving the desired pattern of transparent conductive material adhering to the substrate. Two electrically conductive patterns may be formed in intersecting relationship and isolated, one from the other. The degree of electrical connection between the two patterns will be a function of the resistance of the polycrystalline material therebetween at points of crossing. In some instances, electroluminescence may be obtained by selecting the proper crystalline material wherein an electrical display may be created by selectively energizing crossing electrical conductors.

23 Claims, 7 Drawing Figures

PROCESS FOR FORMING PATTERNED FILMS

This is a division of application Ser. No. 186,855, filed Sept. 15, 1980, now U.S. Pat. No. 4,344,817.

BACKGROUND OF THE INVENTION

This invention relates generally to a method of forming a high resolution pattern of transparent conductive tin oxide on a transparent vitreous substrate and, more particularly, to a process for forming such a pattern using a polycrystalline material on the substrate in mirror image to the pattern sought to be formed and using a high temperature spray process for forming the tin oxide.

The electrical display industry is developing a variety of displays which require a transparent vitreous material having a transparent electrically conductive coating formed thereon. The transparent electrically conductive coating is generally formed in a conductive pattern for conducting electrical current from edge portions of the substrate to central locations defining the display area. In one embodiment, the transparent pattern defines portions of the display for activating liquid crystals or gas discharge displays located therebehind and forming the desired visible pattern. Generally, a highly transparent and electrically conductive layer is required.

The prior art has developed many transparent electrically conductive materials which can be formed in suitable patterns. A particular material is a thin film of tin oxide formed with a dopant to increase the electrical conductivity of the thin tin oxide film. However, conventional dopants are frequently not stable at high temperatures. Accordingly, it would be desirable to use an undoped film of tin oxide where the resulting film must be subjected to high temperatures, either in further processing or in final application.

However, it is difficult to form films of tin oxide having the requisite high conductivities since film formation generally requires the use of high temperatures to improve the adherence of the tin oxide to the transparent vitreous substrate. In a conventional technique using conventional photolithographic masking layers to form a negative image of the desired pattern, the tin oxide is formed in the exposed portions of the substrate. Conventional photolithographic materials do not perform well when subjected to the high temperatures required for a suitable tin oxide film and can even interfere with forming transparent conductive films, either by introducing impurities during the heating process or by degrading during heating to a degree that high resolution films are not possible.

One prior art solution to this problem, as shown in U.S. Pat. No. 4,009,061, is to form the film of tin oxide over the entire substrate surface and thereafter chemically etch the film to form the desired pattern. The tin oxide is relatively inert and a hot solution of metal in acid is required to reduce the selected portion of the tin oxide for removal.

Another prior art solution is depicted in U.S. Pat. No. 3,928,658, where a metallic layer is used to form the negative portion of the desired pattern. The selected metal is generally more easily removed than the overlying tin oxide when subjected to relatively weak solvent solutions. However, removal of the tin oxide layer requires the solvent to penetrate the tin oxide layer to the underlying metallic layer and this can be difficult. A conventional process employs a vacuum deposition system for forming both the substrate masking layer and the electrode area. The resulting film of tin oxide overlying the masking layer is relatively continuous and thereby resistant to solvent penetration for masking layer removal.

An undoped tin oxide film having a low electrical resistivity has been developed by Photon Power, Inc., as described in U.S. Pat. Nos. 3,880,633 and 3,959,565, and pending patent application Ser. No. 886,890, now U.S. Pat. No. 4,224,355. However, the tin oxide film is formed by a spray technique which requires temperatures near the softening point of glass in order to obtain the desired optical and electrical characteristics. Thus, using the prior art masking techniques hereinabove discussed is extremely difficult with respect to forming a high resolution conductive pattern.

In many applications it may be desirable to form two or more intersecting electrically conductive patterns which are electrically insulated from one another. In the above referenced conventional techniques, the masking material may be a metal which does not serve to insulate between the intersecting conductive strips or may be a conventional photolithographic masking material which degrades at high temperatures. Furthermore, the tin oxide film can be poorly adherent to materials and form crossing junctions which are easily damaged.

Yet another problem occurs where chemical etching is used. Under-etching occurs where portions of the tin oxide film are in contact with the etchant for longer than other portions of the tin oxide films, leading to a loss in resolution available for the circuit. The minimum spacing is controlled by the ability to control the etchant rather than the ability to deposit the films.

The disadvantages of the prior art are overcome by the present invention, however, where an improved process is provided for forming the electrically conductive pattern using a polycrystalline material to form the mirror image.

SUMMARY OF THE INVENTION

In a preferred embodiment of the present invention, a pattern of transparent conductive material is formed on a transparent vitreous substrate using a polycrystalline material to mask the substrate surface while depositing material forming the transparent conductive layer. The polycrystalline material and any overlying transparent conductive material are easily removed by a chemical etch, leaving the desired pattern of transparent conductive material adhering to the substrate.

In a particularly desired form of the present invention, the transparent conductive layer is deposited using a spray process which forms a highly conductive and tightly adherent film on the substrate. The polycrystalline material is not affected by the high temperature required for the spray process. A preferred transparent conductive material is tin oxide, represented as $SnO_x$, where "X" is slightly less than the stoichiometric value of two (2).

In a preferred form of the present invention, the polycrystalline material may be cadmium sulfide (CdS) or zinc sulfide (ZnS), having crystal diameters of 0.02–0.2 microns. Where a spray process is used to form the polycrystalline material, the actual range of crystal sizes will be a function of the concentration of materials in the sprayed solution and of the temperature of the substrate during formation of the crystals.

In another embodiment of the present invention, two electrically conductive patterns may be formed in intersecting relationship and isolated, one from the other. In this embodiment, a second polycrystalline mask is formed to expose the second pattern on the areas of the substrate exclusive of the first pattern. It may be desirable to use a range of smaller crystal diameters than used in forming the first pattern. After the second transparent conductive layer is formed, photolithographic masking techniques are used to form masked areas over each point of the second pattern which crosses the first pattern. Subsequent removal of the polycrystalline mask will not affect those areas covered by the masking material, leaving the conductive elements separated by the polycrystalline material. The degree of electrical connection between the two patterns will then be a function of the resistance of the polycrystalline material. In some instances, electroluminescence may be obtained by selecting the proper crystalline material wherein an electrical display may be created by selectively energizing crossing electrical conductors.

One advantage of the present invention is the formation of undoped transparent conductive materials in a selected pattern.

Another advantage is the formation of high resolution patterns of transparent conductive films.

Yet another advantage is the formation of electrically conductive transparent films using spray processes for the masking materials and the transparent conductive material.

Another advantage of the present invention is the formation of a plurality of electrically conductive patterns in insulated intersecting relationship where the insulating material can have a variety of desired properties.

A feature of the present invention is the manufacture of a transparent electrically conductive circuit using a polycrystalline material having a selected range of crystal sizes to form a negative image of the desired pattern.

Another feature is forming a transparent electrically conductive circuit using a spray process to form a layer of transparent electrically conductive material.

One other advantage is to provide a process for forming a transparent electrically conductive circuit by removing polycrystalline masking material and the transparent conductive material thereon, leaving the transparent electrically conductive material in the desired circuit pattern.

These and other features and advantages of the present invention will become apparent from the following detailed description, wherein reference is made to the figures in the accompanying drawings.

IN THE DRAWINGS

DETAILED DESCRIPTION

Figure 1:
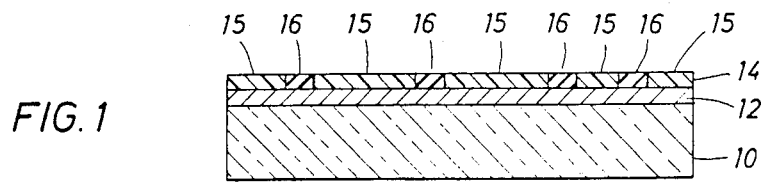
FIG. 1 is a cross-sectional view of an intermediate product.

Referring now to FIG. 1, there is depicted a cross-sectional view of transparent vitreous substrate 10 during the process of forming a polycrystalline mask on the substrate 10. Polycrystalline layer 12 has been formed over the entirety of substrate 10 and a layer of photolithographic masking material 14 has been coated on to polycrystalline layer 12. As depicted in FIG. 1, the photolithographic material has been treated to form areas 15, which are resistant to chemical etching, and areas 16, which are readily removed in a chemical etch.

A primary end product of the present invention is an electrical display wherein the electrically conductive pattern is used to generate an electrical field which, in turn, affects adjacent material to obtain a visually distinguishable pattern. Thus, substrate 10 is generally a suitable transparent material, such as glass or quartz. As hereinafter explained, substrate 10 is preferably a vitreous material which can be subjected to high temperatures.

A polycrystalline material is preferably selected to form layer 12, which will form the masking pattern on substrate 10. As hereinabove discussed, difficulties exist in the prior art with respect to providing a suitable masking material which does not degrade or contaminate the transparent conductive material when subjected to very high temperatures. Some masking materials which can withstand high temperatures, such as metals, may be difficult to remove where a continuous film of the transparent conductive material is also formed over the masking material. Further, metallic materials are generally electrically conductive and cannot be used to insulate between crossing patterns of conductors.

Thus, a polycrystalline material 12 has been selected in order to obtain easy and accurate removal of portions of the subsequently applied transparent conductive layer outside the desired pattern. The ease of removal is functionally related to the crystallinity, or crystal sizes, of the polycrystalline material. The polycrystalline surface will be uneven due to the multicrystalline nature of layer 12, and a discontinuous layer of transparent conductive material will be formed, permitting an etching material to quickly penetrate and remove the polycrystalline material. The prompt removal of the masking material with relatively weak reagents permits high resolution films to be formed, as hereinafter explained.

A particularly suitable polycrystalline material is comprised of cadmium sulfide. In a preferred embodiment, the cadmium sulfide film is formed by spraying solutions onto a heated substrate surface where the solutions react to form the cadmium sulfide layer. The polycrystalline film is formed to a thickness which is sufficient to form a uniform layer over the substrate surface which is substantially free of defects which might expose portions of the surface. Film thicknesses of 0.5–1.5 microns are generally sufficient using the processes hereinafter described.

In particular, U.S. patent application Ser. No. 886,890 and No. 886,891, now U.S. Pat. Nos. 4,224,355 and 4,239,809 respectively, both assigned to Photon Power, Inc., which disclosures are incorporated herein by reference, describe processes for forming high quality films of cadmium sulfide and tin oxide for use in photovoltaic cells. The cadmium sulfide and tin oxide films produced by the process described therein are suitable for use in forming the polycrystalline mask and the transparent conductive layer, respectively.

Referring first to the polycrystalline layer of CdS, a suitable spray solution forming CdS crystals in the range of 0.1 to 0.2 microns is prepared in the following proportions:

| | |
|---|---|
| 800 cc | Water |
| 13.7 gms | $CdCl_2 \cdot 2.5\ H_2O$ |
| 6.13 gms | Thiourea |

A second CdS spray solution forming crystals having diameters in the range of 0.02 to 0.05 microns is prepared in the following proportions:

| | |
|---|---|
| 5 l. | Water |
| 150 cc | Thiourea (1 Molar solution) |
| 150 cc | $CdCl_2$ (1 Molar solution) |

The selected solution is sprayed while the substrate is heated to a temperature in the range of 250°–400° C. to obtain the desired crystal sizes. The substrate temperature which is selected for a particular concentration of sprayed materials may be varied to more particularly define the crystal sizes within the range generally produced by that concentration of materials. Higher temperatures result in smaller crystal diameters being produced from the sprayed materials or, in other words, the crystallinity is decreased by increasing the temperature. It should be noted that the patents and patent applications referenced herein, and directed to forming photovoltaic cells generally subject the CdS layer to a heat treatment subsequent to the spray process for forming larger diameter crystals. This heat treatment step is not performed when forming a polycrystalline mask herein.

The CdS film formed with the above mentioned crystal sizes has a glass-like appearance, although the polycrystalline nature of the film is clearly shown under a scanning electron microscope. A film thickness of about 1.5 microns is generally sufficient to insure against pinhole defects in the layer of CdS.

In addition to $CdCl_2$, there are many suitable spray solutions capable of forming the polycrystalline masking materials. More particularly, a ZnS film may be formed by substituting $ZnCl_2$ in place of the $CdCl_2$ in the above spray formulations. U.S. Pat. No. 4,095,006, issued June 13, 1978, which enclosure is incorporated herein by reference, discloses a number of cadmium salts and solutions which may be used to form suitable cadmium sulfide films. Further, cadmium thiocyanate may also be sprayed, eliminating the need for a separate sulphur-containing compound.

Thus, a variety of polycrystalline films may be formed which function satisfactorily. The basic functional requirements, when met, act to assist in obtaining a high resolution for the subsequent electrically conductive circuit. A thin film is desired to minimize the time required for film removal, thus minimizing any undercutting of the transparent conductive film forming the circuit pattern. The acceptable range of crystal sizes includes crystals large enough to obtain the discontinuous surface which assits in film removal, but small enough to maintain the desired resolution. Larger crystals can reduce the resolution along pattern edges and can provide for capillary action between crystals which increase the incidence of shorting defects.

As hereinbelow shown, the precision with which the overlying 30 photolithographic mask can be formed is reduced and the resulting resolution of the negative image which defines the desired transparent electrically conductive pattern. However, as hereinabove explained, the spray solution concentration and the substrate temperature can be coordinated to obtain an optimum process for the particular circuit configuration being formed.

Once the polycrystalline layer is completed, the negative image of the desired pattern is formed in the mask. Referring again to FIG. 1, a conventional photolithographic mask is formed over the polycrystalline layer using conventional photosensitive materials which are resistant to chemical action when developed. Many suitable proprietary materials are available from manufacturers such as Kodak and Shipley. It is desirable that the material use a water based developer to minimize subsequent chemical contamination. It is also desirable that the chemically resistant material remaining after developing and etching be volatile at the temperatures used to form the transparent conductive layer. As is well known in the art related to photolithographic masking, either a positive or a negative resist may be used in order to define the desired pattern for exposing the polycrystalline layer.

As further shown in FIG. 1, photoresist layer 14 has been applied by any standard technique such as roller application, spray application, or a dip process. The applied photoresist material is exposed, as hereinabove explained, to define areas 15 of the photoresist which are resistant to chemical activities and areas 16 of resist layer 14 which are easily removable. Thus, after being developed, photoresist layer 14 has areas 15 which define the negative image of the pattern for the electrically conductive material.

Figure 2:
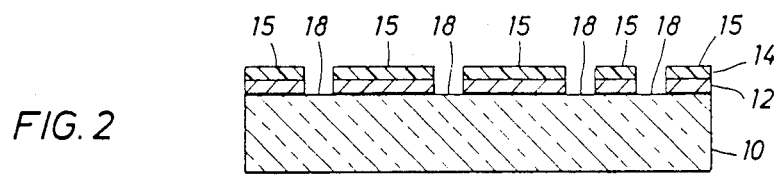
FIG. 2 is a cross-sectional view of the circuit negative pattern.

Referring now to FIG. 2, there is depicted the layered configuration after etching the polycrystalline layer 12 has been completed. The chemically resistant areas 15 of photoresist layer 14 protect the underlying cadmium sulfide layer 12 wherein the unprotected areas are removed leaving exposed areas 18 of substrate 10. Where the polycrystalline layer 12 is formed of CdS, a suitable etching material is formed from a ten-percent aqueous solution of HCl (0.3N solution). Using the above process, substrate 10 now has exposed areas 18 in the configuration of the desired electrically conductive pattern.

Figure 3:
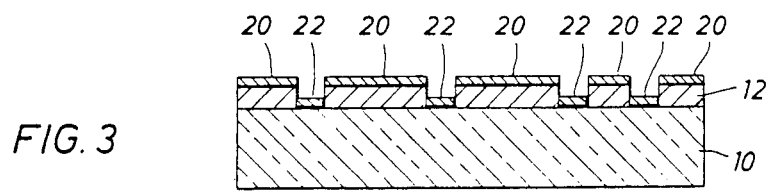
FIG. 3 is a cross-sectional view of an intermediate product.

The next process step, depicted in FIG. 3, is the formation of an electrically conductive material over the entie area of substrate 10. A transparent electrically conductive film having highly desirable properties relating to optical transparency, adherence, and electrical conductivity may be formed using a spray pyrolysis process as defined in U.S. patent application Ser. No. 886,890, filed Mar. 15, 1978, now U.S. Pat. No. 4,224,355, which disclosure is incorporated herein by reference. As taught in the subject patent, a solution containing a tin salt in an organic solvent is prepared, including a fluorine-containing compound, typically in the following proportion:

| | |
|---|---|
| 300 ml | $CH_3OH$ (Methanol) |
| 2.5 ml | HCl (concentrated) |
| 1.7 gms | $NH_4HF_2$ |

| | |
|---|---|
| -continued | |
| 49.6 gms | SnCl$_2$.2H$_2$O |

The solution is preferably sprayed over the substrate while the substrate is heated to maintain the temperature in the range of 440°–480° C., throughout the spray process. The resulting electrically conductive film forms a very tightly adherent and chemically resistant layer 22 on substrate 10.

The film portion 20 which forms over the remaining polycrystalline layer 12 is affected by the crystallinity of layer 12 as herein described. Although portion 20 of electrically conductive layer is depicted as a smooth continuous layer, the crystals forming polycrystalline layer 12 generally act to disrupt portion 20 to a degree sufficient for a subsequent etching chemical to penetrate and remove layer 12. The larger the crystal size, the faster the layers 12 and 20 are removed. Large crystals, however, also act to increase the incidence of pin-hole defects and reduces pattern edge resolution. Small diameter crystals reduce the above effects and a mild abrading of the surface will generally increase the removal rate to acceptable levels. The high substrate temperature required to form the desired electrically conductive film also acts to volatilize the areas 15 of the photoresist layer 14 (see FIG. 2) which remain after the chemical etch. The cadmium sulfide crystalline layer 12 is relatively unaffected by these high temperatures, except that some crystal growth may occur as a result of the high temperatures, which generally increases the ease of removing this layer.

Figure 4:
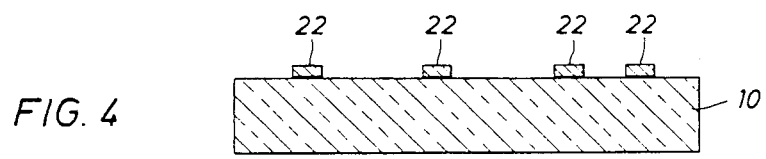
FIG. 4 is a cross-sectional view of a completed conductive circuit.

FIG. 4 illustrates a cross-sectional view of the comleted circuit pattern, having electrically conductive areas 22 formed on substrate 10 to define the desired pattern. The finished product is formed by etching the layered configuration depicted in FIG. 3 typically in an aqueous solution of HCl (0.5–0.8N) for the time needed to remove polycrystalline layer 12 and, therewith, the conductive areas 20 formed over the polycrystalline material 12. Thus, the etching material does not have to act directly on the electrically conductive material, permitting relatively weak etching chemicals to be used. The selected HCl etchant produces substantially no undercutting of the remaining electrically conductive film 22 and an extremely high pattern resolution may be obtained since no allowance is required for etchant undercutting.

Figure 5:
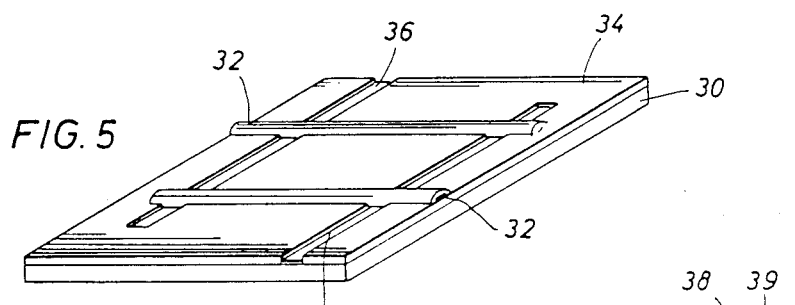
FIG. 5 is an isometric view of an intermediate product where crossing conductors are provided.

In another embodiment of the present invention, a three dimensional conductor configuration may be obtained. As shown in FIG. 5, a first electrically conductive pattern containing conductors 32 has been formed on substrate 30 using the process hereinabove described for FIGS. 1-4. A second polycrystalline layer 34 has been formed over the entire area of substrate 30, including the first conductive pattern 32. As hereinabove described, portions of polycrystalline layer 34 have been removed to expose a second conductive pattern 36. Conductive pattern 36 is configured to maintain second polycrystalline layer 34 where second conductive pattern 36 crosses first conductive pattern 32. For ease of illustration, a protective photoresist layer is not depicted in FIG. 5, although such a layer could be present, but which volatilizes during the formation of the electrically conductive layer on exposed areas 36.

Figure 6:
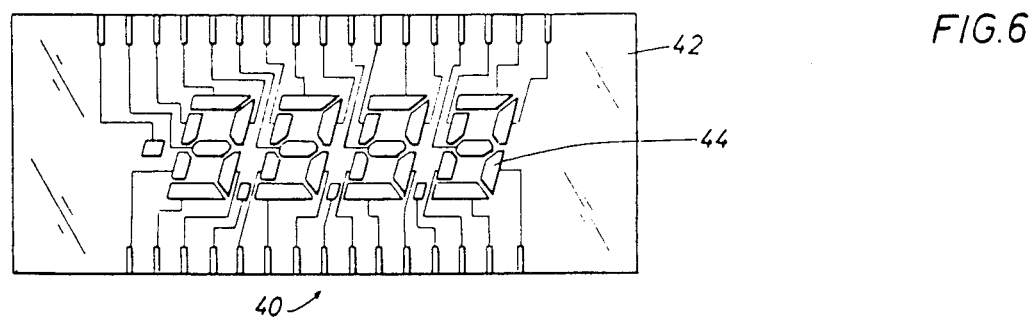
FIG. 6 is a cross-sectional view of a completed crossing conductor circuit.

Referring now to FIG. 6, there is depicted a cross-sectional illustration of the two electrically conductive patterns at selected crossing points. The first conductive pattern 32 is formed on substrate 30. Second conductive pattern 37 is formed on substrate 30 and over portions of the second polycrystalline layer 38 at the junction points. Thus, the second conductive pattern 37 is separated from the first conductive pattern 32 by polycrystalline material 38. As hereinabove explained, other portions of the electrically conductive material form on the other exposed portions of the second polycrystalline layer 34.

To complete the three dimensional conductor configuration, a chemically resistant material 39, such as a conventional photoresist material, is formed over the junction regions of electrically conductive patterns 32 and 37 to protect the underlying polycrystalline layer 38 during the final chemical etch. Accordingly, the final chemical etch removes those portions of the second polycrystalline layer 34 not protected by the chemically resistant areas 39 thereby affecting removal of any overlying electrically conductive material. The remaining materials form the three dimensional electrically conductive pattern.

As hereinabove explained, the three dimensional configuration can be formed to a high degree of resolution wherein the junction points form a matrix of dots conventient for generating data displays. In this embodiment, a suitable polycrystalline material may be formed by using ZnS as the polycrystalline material with copper added to dope the ZnS to form a phosphor. Activating a suitable pair of crossing conductors would activate the phosphor wherein the dot would luminesce. Since the above spray process is suitable for filming large areas of substrate, a large area graphical display could be created using the process hereinabove described.

Figure 7:
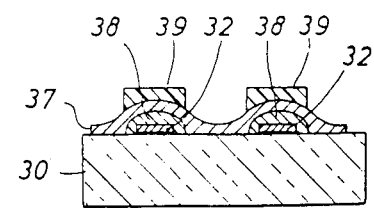
FIG. 7 is a plan view of a typical configuration of a transparent electrically conductive circuit.

Referring now to FIG. 7, there is depicted a typical pattern of electrical conductors useful for activating a numerical display using liquid crystals. The completed circuit pattern 40 is formed from transparent substrate 42 having transparent electrically conductive pattern 44 formed thereon. The ability to form circuit patterns with a high resolution permits a closely packed display to be used, thus minimizing the space required to mount the display. Further, the transparent conductive film 44 formed as hereinabove described, at high temperatures, is highly transparent and does not detract from the activated display beneath the circuit pattern. The high electrical conductivity of the film which forms conductive pattern 44 results in minimizing electrical usage and heating of the display. Many other electrical circuits and displays are possible using the process hereinabove described, FIG. 7 being merely illustrative of a typical use for the transparent electrically conductive pattern.

It is therefore apparent that the present invention is one well adapted to attain all of the objects and advantages hereinabove set forth, together with other advantages which will become obvious and inherent from a description of the process itself. It will be understood that certain combinations and subcombinations are of utility and may be employed without reference to other features and subcombinations. This is contemplated by and is within the scope of the present invention.

What is claimed is:

1. A method of manufacture for forming patterned films, comprising the steps of:

heating a transparent vitreous substrate surface to a first selected temperature, spraying a solution containing a concentration of polycrystalline forming materials onto said heated substrate surface, said substrate temperature and said concentration of materials cooperating to form a first layer of polycrystalline material having a selected range of crystal diameters, selectively removing portions of said polycrystalline material from said substrate to define a first pattern of exposed substrate, forming a first film of a pattern material to a selected thickness over said exposed substrate and remaining portions of said layer of polycrystalline material, said selected thickness cooperating with said selected range of crystal diameters to form a discontinuous surface of said film of pattern material over said remaining portions of said layer of polycrystalline material, and penetrating said discontinuous surface with a chemical etchant to remove said remaining portions of said layer of polycrystalline material and overlying portions of said pattern material therewith, so that remaining portions of said pattern material form a first patterned film on said substrate surface.

2. The method of claim 1, wherein said layer of polycrystalline material is a compound of cadmium or zinc.

3. The method of claim 1, wherein selectively removing said polycrystalline material includes the steps of:
forming a photomask exposing said polycrystalline material corresponding to said desired pattern,
chemically removing said exposed polycrystalline material, and
heating said substrate to volatilize remaining portions of said photomask before forming said film of pattern material.

4. The method of claim 3, wherein said layer of polycrystalline material is a compound of cadmium or zinc.

5. The method of claim 1, wherein forming said film of pattern material comprises the steps of:
heating said substrate surface to a second selected temperature, and
spraying a pattern forming solution on said substrate surface while heating said substrate surface.

6. The method of claim 5, wherein said step of spraying a pattern forming solution includes spraying a pattern forming solution which includes a tin salt to form an electrically conducting first patterned film on said substrate.

7. The method of claim 5, wherein said step of heating said substrate surface to a second temperature includes the step of heating the substrate surface to a temperature in the range of 440° C. to 480° C.

8. The method of claim 5 or claim 6 wherein selectively removing portions of said polycrystalline material includes the steps of:
forming a photomask on the polycrystalline material to expose surface areas of the polycrystalline material in said first pattern for chemical etching,
chemically etching the polycrystalline material in said first pattern to expose the surface of said substrate in the first pattern; and
heating said substrate to volatilize remaining portions of said photomask before forming said film of a pattern material.

9. A method according to claim 1, including the step of forming said layer of polycrystaline material with crystal diameters in the range of 0.02 to 0.20 microns.

10. The method of claim 1, wherein said step of spraying includes spraying materials which form a polycrystalline layer made of a compound of cadmium or zinc.

11. The method of claim 1, wherein penetrating said discontinuous surface with a chemical etchant includes the step of etching the discontinuous surface with a solution of HCl.

12. The method of claim 1, further including the step of abrading said discontinuous surface prior to penetrating the surface with a chemical etchant.

13. The method of claim 1, wherein said step of spraying includes spraying materials which form a polycrystalline layer of zinc sulfide.

14. The method of claim 1, wherein said step of spraying includes spraying materials which form a polycrystalline layer of cadmium sulfide.

15. The method of claim 1, wherein forming a film of pattern material includes the step of forming an electrically conducting transparent film of tin oxide.

16. The method of claim 1, further including forming a second patterned film of a selected material in a crossing relationship with said first patterned film.

17. The method of claim 1, wherein said step of forming a first film of pattern material includes the step of forming said film of a transparent electrically conducting material, so that the step of penetrating said discontinuous surface provides a transparent electrically conducting first patterned film in said first pattern on said substrate;

the method of claim 1, further including the steps of:
forming a second layer of electroluminescent polycrystalline material over said substrate and said electrically conducting first patterned film, said second layer of polycrystalline material having a selected range of crystal diameters,
masking said second layer of polycrystalline material to define a second pattern in crossing relation with said first pattern,
chemically etching said second layer of polycrystalline material to expose the surface of said substrate in all areas of said second pattern except crossover areas at which the second pattern crosses over the first pattern,
forming a second film of a transparent electrically conducting material to a selected thickness over said exposed substrate and remaining portions of said second layer of polycrystalline material, the selected thickness cooperating with the selected range of crystal diameters of the second layer of polycrystalline material to form a discontinuous surface of the second film over said remaining portions of the second layer of polycrystalline material,
masking said crossover areas of the second layer of polycrystalline material, and
chemically etching the remaining portions of the second layer of polycrystalline material and overlying portions of said second film except for the masked crossover areas, so that a transparent electrically conducting second patterned film is formed in crossing relation with said transparent electrically conducting first patterned film and the patterned films are separated in insulated reaction at said crossover areas by said electroluminescent polycrystalline material.

18. The method of claim 17, wherein said step of forming a second layer of electroluminescent polycrystalline material includes forming said second layer with zinc sulfide doped with copper.

19. The method of claim 17, wherein said step of forming said second layer of polycrystalline material includes the step of forming the polycrystalline material with crystal diameters in the range of 0.02 to 0.2 microns.

20. The method of claim 17, wherein said steps of forming said first and second films each include the step of forming a film made of tin oxide.

21. The method of claim 17, wherein said steps of forming said first and second films each include the step of forming a film to a thickness in the range of 0.5 to 1.5 microns.

22. The method of claim 1, wherein said step of heating includes the step of heating said substrate surface to a temperature in the range of 250° C. to 400° C.

23. The method of claim 1, wherein said step of forming a first film of a pattern material includes the step of forming said film to a thickness in the range of 0.5 to 1.5 microns.

* * * * *

UNITED STATES PATENT AND TRADEMARK OFFICE
CERTIFICATE OF CORRECTION

PATENT NO. : 4,502,917

DATED : March 5, 1985

INVENTOR(S) : Rhodes R. Chamberlin

It is certified that error appears in the above-identified patent and that said Letters Patent is hereby corrected as shown below:

Column 4, line 61, delete "application" and
    insert therefor --applications--.

Column 5, line 66, delete "assits" and
    insert therefor --assists--.

Column 6, line 54, delete "entie" and
    insert therefor --entire--.

Column 7, line 7, after "440°-480°C."
    delete ",".

Column 8, lines 25-26, delete "conventient" and
    insert therefor --convenient--.

Column 10, line 64, delete "reaction" and
    insert therefor --relation--.

Signed and Sealed this

Fifteenth Day of July 1986

[SEAL]

Attest:

DONALD J. QUIGG

Attesting Officer

Commissioner of Patents and Trademarks